(12) United States Patent
Borgognoni et al.

(10) Patent No.: US 6,344,422 B1
(45) Date of Patent: Feb. 5, 2002

(54) METHOD OF DEPOSITING A BSG LAYER

(75) Inventors: Bruno Borgognoni, Alfortville; François Leverd, Cesson; Bruno Sauvage, Montgeron; Pierre Vekeman, Boissise-le-Roi, all of (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/574,890

(22) Filed: May 19, 2000

(30) Foreign Application Priority Data

May 20, 1999 (EP) .............................. 99480037

(51) Int. Cl.$^7$ ............................. H01L 21/31
(52) U.S. Cl. .................. 438/778; 438/783; 427/578; 427/535
(58) Field of Search ................ 438/778, 950, 438/700, 783, 784; 427/576, 578, 252, 535

(56) References Cited

U.S. PATENT DOCUMENTS 4,269,654 A * 5/1981 Deckert et al.
5,862,057 A * 1/1999 Xia et al.
6,190,955 B1 * 2/2001 Ilg et al.

FOREIGN PATENT DOCUMENTS

EP   989598 A2 * 3/2000

* cited by examiner

Primary Examiner—Caridad Everhart
(74) Attorney, Agent, or Firm—Ira D. Blecker

(57) ABSTRACT

A boro-silicate-glass (BSG) is deposited on a silicon substrate coated with a bottom SiO2 and an overlying Si3N4 layer by LPCVD using an O3/TEB/TEOS mixture at low pressure (less than 300 mTorr), low temperature (less than 500° C.) and a TEB flow which is adjusted to have a boron concentration in the BSG layer less than 10% (in weight). The BSG material deposited that way has been found to be resistant to aggressive silicon dry etch chemistries and is easily and rapidly etched in standard BSG etchants. However, very high etch rates are obtained with a HF/ethylene glycol wet chemistry. The disclosed BSG deposition method finds a valuable application in the fabrication of the buried plate in deep trench cell capacitors because no undercuts are produced in the bottom SiO2 layer sidewall exposed in the trench during the BSG layer removal.

7 Claims, 5 Drawing Sheets

METHOD OF DEPOSITING A BSG LAYER

FIELD OF THE INVENTION

The present invention relates to the manufacture of semiconductor integrated circuits (ICs) and more particularly to an improved method of depositing a boro-silicate-glass (BSG) layer onto a semiconductor structure. The method finds a valuable application in the fabrication of the buried plate in deep trench storage capacitors.

BACKGROUND OF THE INVENTION

In the manufacture of semiconductor integrated circuits and particularly in dynamic random access memory (DRAM) chips, deep trenches are extensively used. As known for those skilled in the art, in DRAM chips, an array transfer transistor, typically an insulated gate field effect transistor (IGFET) and a storage capacitor are associated to form the elementary memory cell. To date, due to scaling reduction effects, the storage capacitor is formed in a deep trench etched in the silicon substrate and includes a buried plate region to improve the capacitor dielectric robustness. In the course of the buried plate fabrication process, a layer of BSG is used as a hard mask during the trench formation. The step of removing said BSG layer is an essential part of the whole buried plate fabrication process.

A conventional buried plate fabrication process is described herein below in conjunction with FIG. 1 and FIGS. 2A–2G. All the processing steps are conducted in the so-called deep trench (DT) module.

FIG. 1 schematically illustrates the starting structure referenced 10 which basically consists of a P-type doped silicon substrate 11 coated with a 10 nm thick silicon oxide (SiO2) layer 12 and a 185 nm thick silicon nitride (Si3N4) pad layer 13. These layers are typically deposited by a low pressure chemical vapor deposition technique (LPCVD).

Now turning to FIG. 2A, a 700 nm thick boro-silicate-glass (BSG) layer 14 is blanket deposited onto the P-type silicon substrate 11 by LPCVD as standard. For instance, the BSG layer 14 is deposited in a LAM 9800 tool, manufactured by LAM Research, Fremont, Calif., USA, using tri-ethyl-boron (TEB) and tetra-ethyl-boro-silicate (TEOS) gases according to the following operating conditions:

| | |
|---|---|
| Temperature | 750–850° C. |
| Pressure | 1.1 Torr |
| TEB flow | 2.6 ml/min (boron concentration: 5% in weight) |
| TEOS flow | 4.4 ml/min |

Next, a photoresist layer (not shown) is deposited onto structure 10, which is baked, exposed and developed as standard according to the desired trench pattern. After resist patterning, the BSG, Si3N4 and SiO2 materials of layers 14, 13 and 12 are sequentially etched, for instance, in the MxP chamber of an AME 5000 plasma etcher, a tool manufactured by Applied Materials, Santa Clara, Calif., USA with the following operating conditions.

| | |
|---|---|
| Temperature | 20° C. |
| Power | 650 Watt |
| Pressure | 95 mTorr |
| CF4 flow | 50 sccm |
| CHF3 flow | 35 sccm |
| Ar flow | 100 sccm |

(sccm denotes standard cubic centimeter per minute).

The resist mask is then stripped by ashing in a FUSION ACU, a tool manufactured by FUSION, Rockville, Md., USA using an O2/N2 mixture as standard. Now the deep trench is etched in the silicon substrate 11. To that end, the BSG layer 14 is used as a hard mask during trench formation. For instance, the trench can be etched in a TEL 88 DRM tool, manufactured by TOKYO ELECTRON Limited, Yamanachi, Japan.

The following operating conditions are adequate.

| | |
|---|---|
| Temperature | 30° C. |
| Power | 1300 Watt |
| Pressure | 95 mTorr |
| HBr flow | 150 sccm |
| NF3 flow | 15 sccm |
| O2 flow | 6 sccm |

The BSG material has to be resistant to the silicon dry etch chemistry, in this case HBr and NF3 which are known to be very aggressive. For instance, with the operating conditions described above, less than 500 nm of BSG material are consumed in the etching of a trench having about 7–8 μm depth. At this stage of the buried plate fabrication, the structure 10 appears as shown in FIG. 2A with a deep trench 15 formed therein.

The BSG layer 14 must be stripped for reasons given later on. Typically, it is stripped with a conventional HF vapor wet process in an EXCALIBUR tool sold by FSI, Chaska, Minn., USA with N2 and HF flows of 60 l/min and 1.5 l/min respectively at 65° C. The etch rate is about 200 nm/min. The resulting structure is shown in FIG. 2B. This wet etch process is essentially isotropic, so that an undesired undercut referenced 16 in FIG. 2B is formed on the SiO2 layer 12 side exposed in the trench 15.

Because, this undercut 16 would be detrimental to the buried plate fabrication process, the Si3N4 layer 13 needs to be partially etched (14 nm) to avoid an excessive overhang above the SiO2 layer 12 and subsequent polysilicon fill problems. This step which is typically performed by wet chemistry is usually referred to as the pullback step in the technical literature. For instance, it can be performed in a MAGNUM SAT wet bench, a tol manufactured by SEMITOOL, Kalispell, Mont., USA using a HF/glycerol bath (1:25 ratio) wherein the HF is diluted in water (49/51 in volume %). FIG. 2C shows structure 10 at this stage of the buried plate fabrication. As apparent in FIG. 2C, thanks to the pullback step, the undercut effect has been clearly reduced.

Now, referring to FIG. 2D, a 400 nm thick arsenic silicon glass (ASG) layer 17 is first conformally deposited onto the structure 10 to entirely coat the trench 15 side wall. In turn, a 2 μm thick resist layer 18 is blanket deposited onto the structure 10 to fill the trench 15.

The resist layer 18 is recessed down to a deepness of 1.3 μm in trench 15 using a O2/CF4 chemistry as standard in an AME 5000 plasma etcher mentioned above, so that the ASG layer 17 is exposed in the upper part of the trench.

Working conditions are:

| | |
|---|---|
| CF4 flow | 5 sccm |
| O2 flow | 150 sccm |
| N2 flow | 10 sccm |
| Power | 600 Watt |
| Pressure | 75 mTorr |

This step is monitored by an etch end point system. First, in the resist planarization step, exposure of the Si3N4 etch stop layer 13 is detected by the CN radiation (388 nm). Next, the signal generated by an interferometer such as the MUL-TISEM 550, an equipment manufactured by SOFIE Inst., Arpajon, France, is monitored to measure the resist amount etched in the trench. The etch process is stopped when the desired depth of 1.3 μm is attained. This step which is thus only monitored by time is very critical to the whole BP fabrication process. A non-uniform BSG layer 14 thickness will be transferred to the resist level 17A which is determining to the BP level definition.

The ASG material of layer 17 which thus becomes exposed is removed in a BHF bath (NH4F/HF/water in the 5:1:48 ratio in volume). Finally, the resist material remaining in trench 15 bottom is stripped as standard. The resulting structure is shown in FIG. 2E.

A TEOS SiO2 layer 19 having a thickness of 50 nm is conformally deposited by LPCVD to coat structure 10. Then, a thermal treatment is performed in a furnace at 950° C. to drive arsenic atoms out of the remaining ASG layer 17 into the substrate 11 to form the buried plate (BP) region 20 as illustrated in FIG. 2F.

Now, the ASG and TEOS materials of layers 17 and 19 are removed from the trench 15 with a conventional wet process using a diluted HF (DHF) solution. As apparent in FIG. 2G, a dual nitride-oxide (NO) dielectric film 21 is conformally deposited onto the structure 10 to entirely coat its surface including the trench 15 sidewall. Finally, doped polysilicon is blanket deposited by LPCVD onto structure 10 to fill the trench 15. The doped polysilicon layer referenced 22 in FIG. 2G is planarized by chemical-mechanical polishing using the Si3N4 pad layer 13 as an etch stop layer.

The BSG layer 14 has to be stripped before ASG layer 17 is deposited because it has a very non uniform thickness after the trench formation process described by reference to FIG. 2A (typically the BSG layer 14 thickness varies from 120 to 400 nm across the wafer). If it is not stripped, this non-uniformity will be transferred during the resist layer 18 recessing (described above by reference to FIG. 2D) so that the formation of the buried plate region 20 is very dependent of the level referenced 17A in FIGS. 2E and 2F of the remaining ASG layer 17 in trench 15. In particular, if level 17A is too low, ASG layer 17 will not play any longer its protective role of the capacitor dielectric. As a result the dimensions of buried plate 20 will also be non-uniform which is detrimental to the whole buried plate fabrication process reliability.

The above buried plate fabrication process which thus requires to remove the BSG material of layer 14 (as described by reference to FIG. 2B) suffers from three main concerns.

1. The BSG layer 14 wet etch strip is done at the initial stage of the trench formation process when the trench is not filled with the polysilicon of layer 22. This wet etch process is essentially isotropic, so that an undesired undercut 16 is formed on the SiO2 layer 12 exposed sides. BSG material of layer 14 is deposited at 780° C. and has a low wet etch rate so that this undercut 16 in the thin SiO2 layer 12 is important.
2. A pullback step is required to reduce the overhang in the Si3N4 pad layer 13 to avoid subsequent polysilicon fill problems.
3. Even if we are able to perform this BSG layer 14 wet etch properly, we are drastically decreasing the process window for the other wet steps in the DT module, and in particular, the conventional wet processes using a diluted HF solution that remove the materials of layers 17 and 19 from the trench. Missing these steps will leave some ASG and TEOS residues on the trench 15 sidewall and change the capacitor dielectric composition from NO to ONO increasing thereby the dielectric film 21 thickness. As known to those skilled in the art, an increase in the capacitor dielectric thickness will decrease the overall trench capacitance (retention time) which is detrimental to memory cell device performance.

BRIEF SUMMARY OF THE INVENTION

It is therefore a primary object of the present invention to provide an improved method of depositing a boro-silicate-glass (BSG) layer onto a semiconductor structure that is resistant to silicon dry etch chemistries and can be easily and rapidly stripped in standard BSG etchants.

It is another object of the present invention to provide an improved method of fabricating the buried plate in a deep trench cell capacitor comprising the step of depositing a boro-silicate-glass (BSG) layer onto a semiconductor structure that is resistant to silicon dry etch chemistries.

It is another object of the present invention to provide an improved method of fabricating the buried plate in a deep trench cell capacitor comprising the step of depositing a boro-silicate-glass (BSG) layer onto a semiconductor structure that is easily and rapidly strippable in standard BSG etchants.

It is another object of the present invention to provide an improved method of fabricating the buried plate in a deep trench cell capacitor comprising the step of depositing a boro-silicate-glass (BSG) layer onto a semiconductor structure that is easily and rapidly strippable in a HF/ethylene glycol bath.

It is still another object of the present invention to provide an improved method of fabricating the buried plate in a deep trench cell capacitor comprising the step of depositing a boro-silicate-glass (BSG) layer onto a semiconductor structure which reduces the total number of processing steps thereof.

According to a general aspect of the method of the present invention, the boro-silicate-glass (BSG) layer is deposited onto a semiconductor structure by LPCVD using an O3/TEB/TEOS mixture at a pressure less than 300 mTorr, a temperature less than 500° C. and adjusting the TEB flow so that the boron concentration is less than 10% (in weight).

Still according to another aspect of the present invention, there is also described a specific HF/ethylene glycol based etchant that allows a very high etch rate and therefore has a high BSG/SiO2 selectivity.

Still according to another further aspect of the present invention, the above step of depositing a boro-silicate-glass (BSG) layer finds a valuable application in a method of fabricating the buried plate in deep trench cell capacitors comprising the steps of:
a) providing a semiconductor structure consisting of a silicon substrate coated with a bottom SiO2 layer and an overlying Si3N4 pad layer;

b) depositing a layer of BSG material onto the structure by LPCVD using an O3/TEB/TEOS mixture at a pressure less than 300 mTorr, a temperature less than 500° C. and adjusting the TEB flow so that the boron concentration is less than 10% (in weight);

c) forming an opening through said BSG, Si3N4 and SiO2 layers to expose the silicon substrate;

d) forming a trench in said silicon substrate using the patterned BSG layer as an in-situ hard mask and an adequate chemistry for silicon dry etching;

e) removing said top BSG layer by a wet process;

f) coating the lower part of the trench with an arsenic-silicon-glass (ASG) layer corresponding to the desired level for buried plate formation; and, g) depositing a tetra-ethyl-ortho-silicate (TEOS) layer to coat the trench interior sidewall and annealing the structure to outdiffuse the arsenic atoms of the ASG layer into the silicon substrate to form the buried plate.

The novel features believed to be characteristic of this invention are set forth in the appended claims. The invention itself, however, as well as other objects and advantages thereof, may be best understood by reference to the following detailed description of the invention to be read in conjunction with the accompanying drawings.

DETAILED DESCRIPTION OF THE INVENTION

Figure 1:
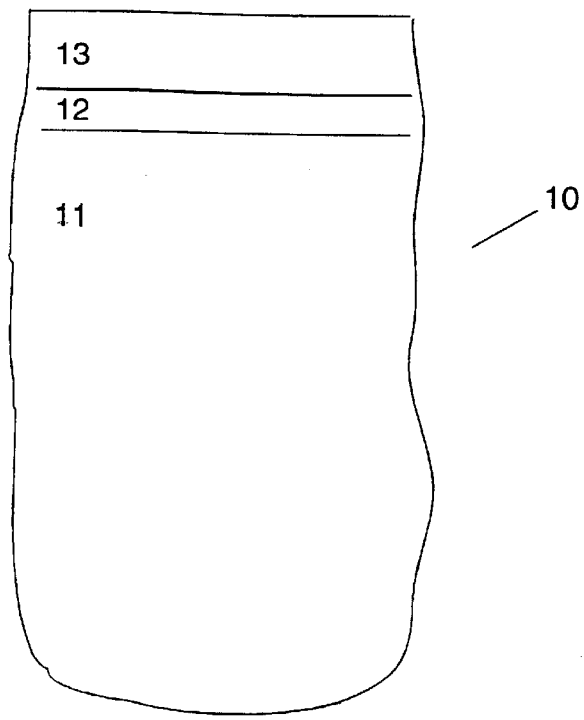
FIG. 1 shows the starting silicon structure at the initial stage of the buried plate fabrication process just before the deep trench is formed in the silicon substrate.
Figure 2A:
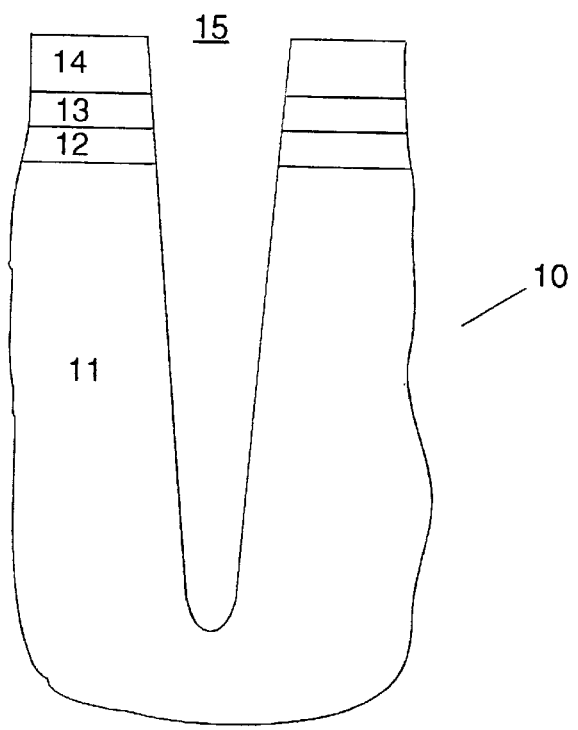
FIGS. 2A–2G show the structure of FIG. 1 undergoing the essential steps of a conventional buried plate fabrication process.
Figure 2B:
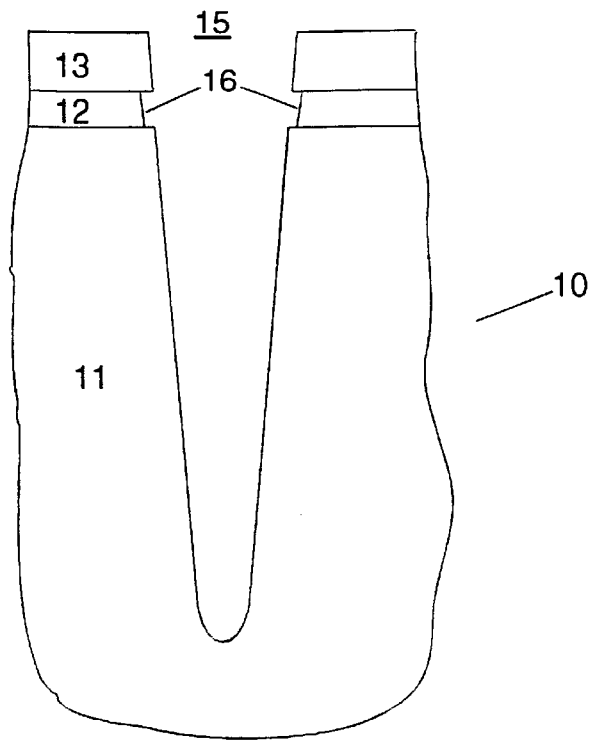
Figure 2C:
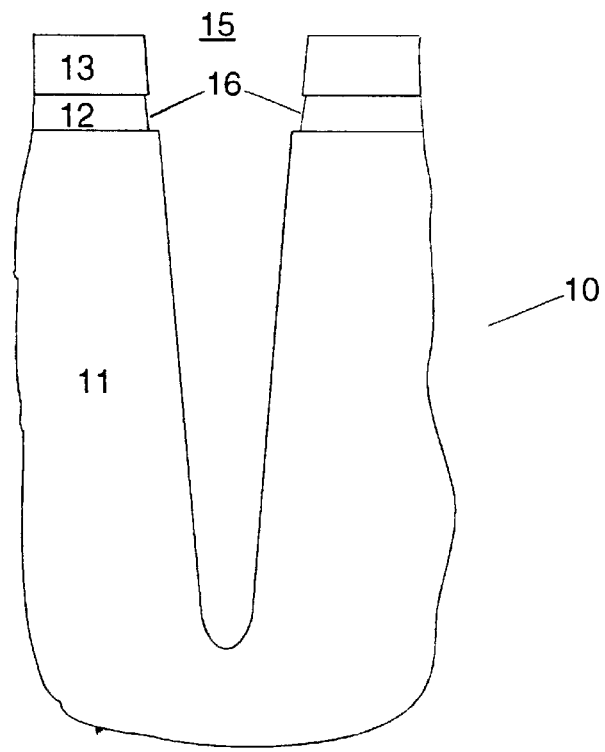
Figure 2D:
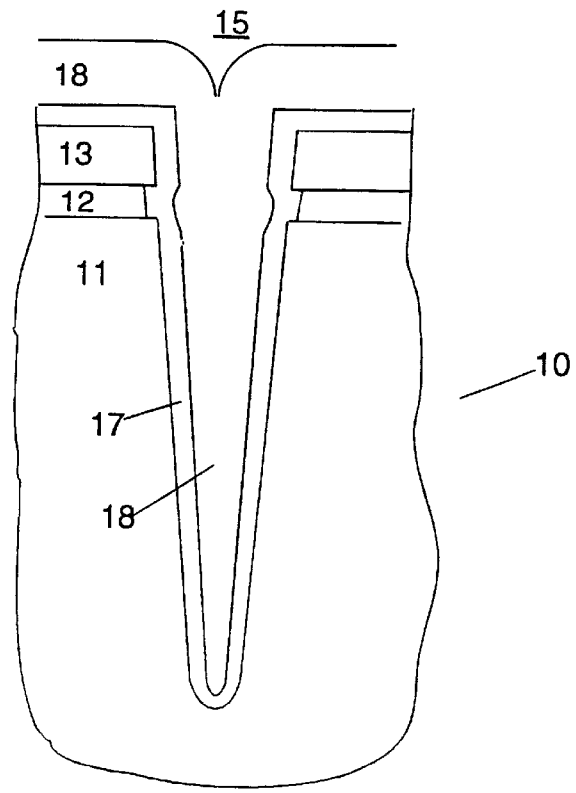
Figure 2E:
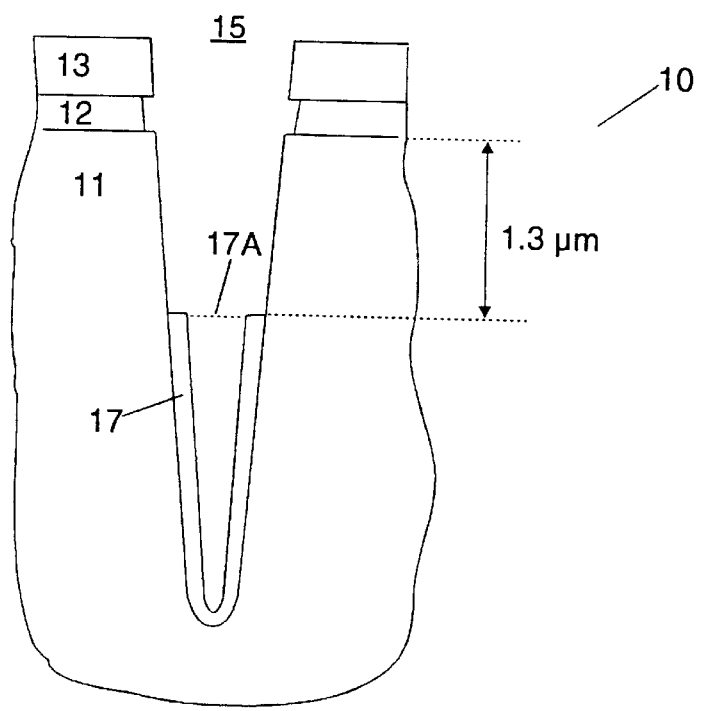
Figure 2F:
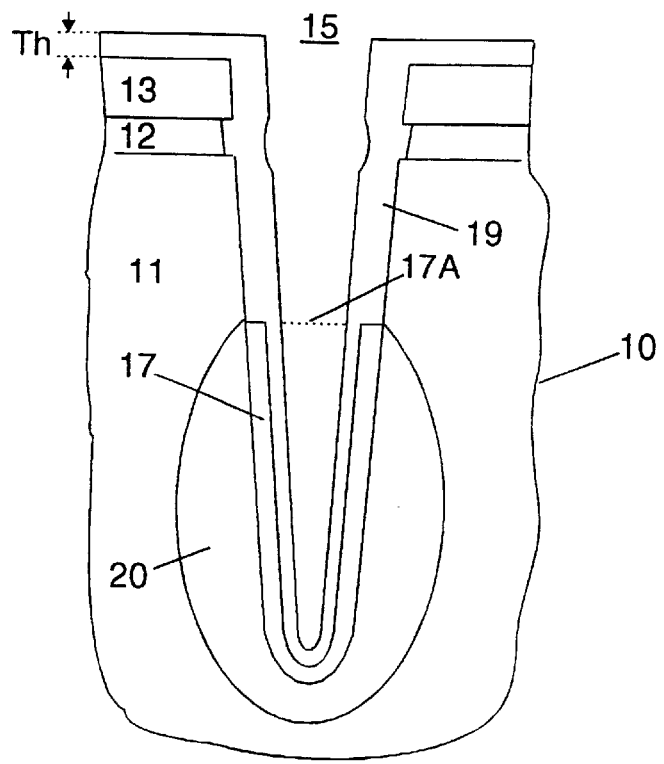
Figure 2G:
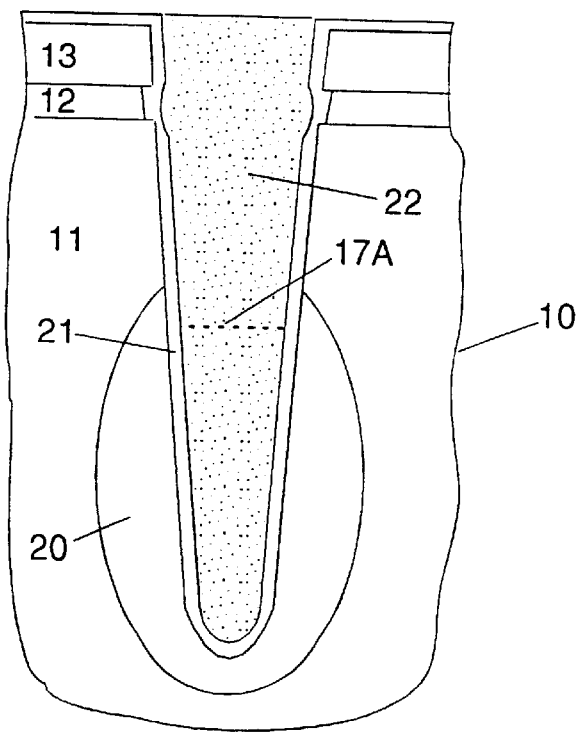

The present inventors sought to discover a way to remove the BSG material of layer 14 without attacking the SiO2 material of underlying layer 12, so that the pullback step mentioned above which consists in a partial removal of the Si3N4 material of pad layer 13 would no longer be required saving thereby a processing step. The purpose was to determine a different BSG chemical structure that would be very easily strippable to have the shortest possible etching time while forming a hard mask very resistant to the aggressive silicon dry etching chemistry (HBr and NF3) used to etch the trench 15 in the silicon substrate 11. Surprisingly, it was discovered that an adequate BSG material could be obtained thanks to a low pressure and temperature deposition step. In addition, according to another significant feature of the present invention, this BSG material is easily strippable in a HF/ethylene glycol bath avoiding thereby the HF/glycerol solution which is difficult to use in a manufacturing environment because of its high viscosity.

The steps of depositing the BSG layer and of removing it according to the present invention are described hereinbelow in conjunction with FIGS. 3A and 3B, still in the course of the buried plate fabrication process described above for the sake of simplicity. Likewise, they are all conducted in the DT module. The initial structure is still the structure depicted in FIG. 1.

Figure 3A:
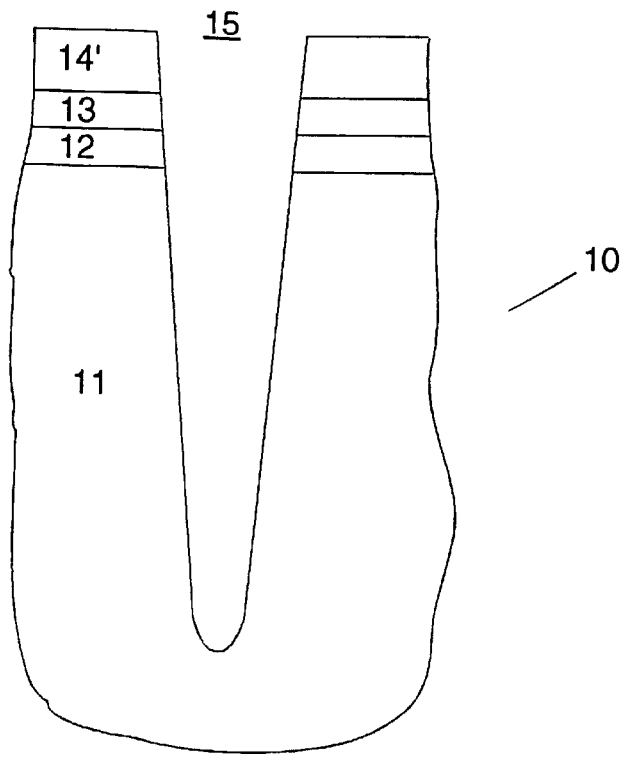
FIGS. 3A and 3B show the structure of FIG. 1 undergoing the two steps of the buried plate fabrication process when the BSG layer is deposited and etched according to the present invention.
Figure 3B:
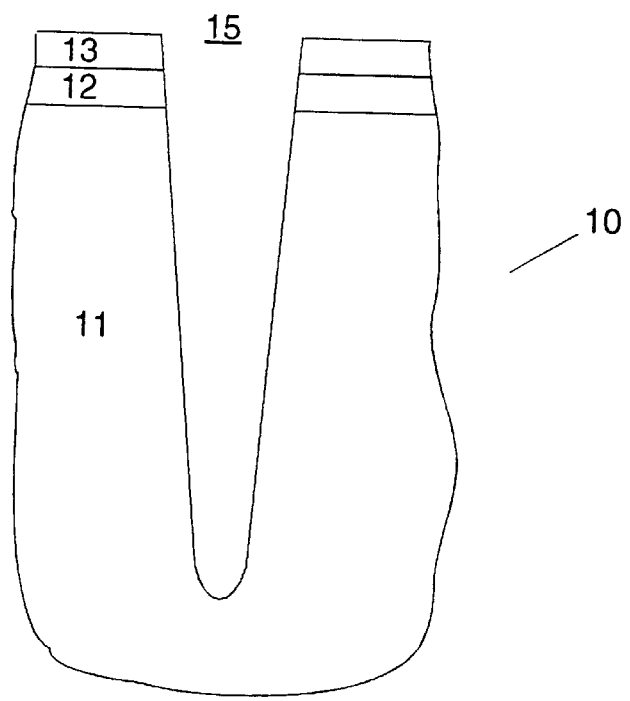

The boro-silicate-glass layer deposited according to the present invention is referenced 14' in FIG. 3A which shows structure 10 of FIG. 1 after patterning the stack of insulating layers. The BSG material of layer 14' is now deposited in an AME P 5000, a tool manufactured by APPLIED MATERIALS, Santa Clara, Calif., USA which incorporates a CVD lamp heated chamber equipped with a precision liquid injection system. The spacing between electrodes is adjusted to about 270 mils. An ozone (O3)/tetra-ethyl-ortho-silicate (TEOS)/tri-ethyl-boron (TEB) mixture is appropriate. Operating conditions must ensure a boron content in the deposited BSG layer 14' of less than 10% and preferably in the 5–8% (in weight) range.

Adequate process parameters are recited below:

| | |
|---|---|
| O3 (12% O2) flow | 3900 sccm |
| TEOS | 1000 mg/min in a 4000 sccm He flow |
| TEB | 300 mg/min |
| Pressure | 200 mTorr (100–300 mTorr) |
| Temperature | 480° C. (400–500° C.) |

Because, the BSG layer 14' is used as a hard mask during trench formation process, it has to be resistant to the trench etch chemistry: HBr and NF3. Experiments have shown that the etch rates are of about 130 nm/min and 120 nm/min for the BSG materials of layers 14 and 14' respectively. This clearly demonstrates that the BSG material of layer 14' is resistant to the HBr/NF3 mixture.

1The BSG material that has been obtained with the above described operating conditions can be completely and rapidly removed because it appears to be less dense than the BSG material obtained with the conventional fabrication process. When it is removed with the standard HF/glycerol process described above, an etch rate of about 600 nm/min (instead of 200 nm/min) is obtained. As a consequence, the undercut is reduced from 27 nm to 8 nm, which is better, but however rather limit to by-pass the pullback step. Much better results are obtained with a HF/ethylene-glycol solution and when the wet etch sequence given below is applied to the wafer batch stored in a tank according to the present invention.

1. Rinsing with ethylene glycol: 15 l/min during 1.5 min at 80° C.
2. Rinsing with HF/ethylene glycol: 18 l/min during 4 min still at 80° C.
3. Rinsing with DI water: 18 l/min during 5 min at 22° C.
4. Rinsing with a O3+DI water solution: 18 l/min during 1 min at 22° C.
5. Rinsing in DI water.

Finally, the wafers of the batch are dried.

With this etch process the BSG material etch rate increases to 1080 nm/min so that no undercut or a negligible undercut 16 (0.5 nm) is produced. Another advantage of using HF/ethylene glycol for this step is the better etch uniformity that is obtained across the wafer. The dispersion is reduced from 2% to 1.3% when the HF/ethylene glycol is used. This seems to come of the lower viscosity of ethylene glycol which significantly improves the first rinsing step. As apparent in FIG. 3B, trench 15 has a smooth sidewall on the totality of its interior surface.

While the invention has been particularly described with respect to a preferred embodiment thereof it should be understood by one skilled in the art that the foregoing and other changes in form and details may be made therein without departing from the spirit and scope of the invention.

What is claimed is:

1. A method of depositing a boro-silicate-glass (BSG) layer onto a semiconductor structure consisting of a silicon substrate coated with a bottom SiO2 layer and an overlying Si3N4 layer comprising the step of:

depositing a layer of BSG material onto the structure by LPCVD using an O3/TEB/TEOS mixture at a pressure less than 300 mTorr, a temperature less than 500° C. and adjusting the TEB flow so that the boron concentration is less than 10% (in weight).

2. The method of claim 1 wherein said boron concentration is in the 5–8% (in weight) range.

3. The method of claim 2 wherein the BSG deposition step is performed in a LPCVD reactor according to the following operating conditions:

| | |
|---|---|
| O3 (12% O2) flow | 3900 sccm |
| TEOS | 1000 mg/min in a 4000 sccm He flow |
| TEB | 300 mg/min |
| Pressure | 200 mTorr |
| Temperature | 480° C. |

4. A method of forming the buried plate in deep trench cell capacitors comprising the steps of:

providing a semiconductor structure consisting of a silicon substrate coated with a bottom SiO2 layer and an overlying Si3N4 pad layer;

depositing a layer of BSG material onto the structure by LPCVD using an O3/TEB/TEOS mixture at a pressure less than 300 mtorr, a temperature less than 500° C. and adjusting the TEB flow so that the boron concentration is less than 10% (in weight);

forming an opening through said BSG, Si3N4 and SiO2 layers to expose the silicon substrate;

forming a trench in said silicon substrate using the patterned BSG layer as an in-situ hard mask and an adequate chemistry for silicon dry etching;

removing said top BSG layer by a wet process;

coating the lower part of the trench with an arsenic-silicon-glass (ASG) layer corresponding to the desired level for buried plate formation; and, depositing a tetra-ethyl-ortho-silicate (TEOS) layer to coat the trench interior sidewall and annealing the structure to outdiffuse the arsenic atoms of the ASG layer into the silicon substrate to form the buried plate.

5. The method of claim 1 wherein said boron concentration is in the 5–8% range.

6. The method of claim 4 wherein the BSG deposition step is performed in a LPCVD reactor according to the following operating conditions:

| | |
|---|---|
| O3 (12% O2) flow | 3900 sccm |
| TEOS | 1000 mg/min in a 4000 sccm He flow |
| TEB | 300 mg/min |
| Pressure | 200 mTorr |
| Temperature | 480° C. |

7. The method of claim 5 wherein said step of removing the BSG layer by wet chemistry comprises the following step sequence applied to the structure:

1. Rinsing with ethylene glycol: 15 l/min during 1.5 min at 80° C.
2. Rinsing with HF/ethylene glycol: 18 l/min during 4 min still at 80° C.
3. Rinsing with DI water: 18 l/min during 5 min at 22° C.
4. Rinsing with a O3+DI water solution: 18 l/min during 1 min at 22° C.
5. Rinsing in DI water.
6. Drying.

* * * * *